United States Patent [19]

Sondermeyer

[11] 4,439,742

[45] Mar. 27, 1984

[54] CIRCUIT FOR SIMULATING VACUUM TUBE COMPRESSION IN TRANSISTOR AMPLIFIERS

[75] Inventor: Jack C. Sondermeyer, Meridian, Miss.

[73] Assignee: Peavey Electronics Corp., Meridian, Miss.

[21] Appl. No.: 299,565

[22] Filed: Sep. 4, 1981

[51] Int. Cl.³ ............................ H03F 3/26; H03F 3/68
[52] U.S. Cl. .................................. 330/262; 330/267; 330/273; 330/124 R
[58] Field of Search ............... 330/262, 267, 268, 274, 330/273, 124 R

[56] References Cited

FOREIGN PATENT DOCUMENTS 1800772  5/1969  Fed. Rep. of Germany ...... 330/262

Primary Examiner—James B. Mullins
Assistant Examiner—G. Wan
Attorney, Agent, or Firm—Berman, Aisenberg & Platt

[57] ABSTRACT

Circuitry is provided for simulating a combination of vacuum tube clipping and soft cross-over characteristics in a transistor power amplifier circuit. A first circuit includes a biasing network for assuring that the transistor amplifier saturates in response to high level input signals. A second circuit includes a biasing network for providing sufficient bias current to maintain the transistor in an active, rather than cutoff, operating region when the first circuit fails to provide the needed bias at times when the instantaneous input signal level is low but average or peak input levels are high. A combining circuit provides the higher of the bias values to the amplifier, to assure that the amplifier saturates for particular high level inputs yet operates at a modified, linear mode for low level inputs, thus simulating a compression characteristic of vacuum tube amplifiers.

13 Claims, 4 Drawing Figures

CIRCUIT FOR SIMULATING VACUUM TUBE COMPRESSION IN TRANSISTOR AMPLIFIERS

BACKGROUND OF THE INVENTION

1. Field of the Invention

This invention relates to power amplifiers, and more specifically to transistorized power amplifiers provided with a compression effect similar to that found in vacuum tube amplifiers.

2. Background Art

Tube type power amplifiers using grounded cathode push-pull designs are well known in the art. In such amplifiers, operated in class AB or class B, for example, where coupling capacitors are used to provide an input signal to the two grids, a phenomenon termed 'tube-compression' is known and appreciated by musicians and other users.

The compression effect results from the overload clipping characteristic of the tube amplifier, in which excessive input drive signals cause the grids of the tubes to be positively biased. For such inputs, in which the peak signal is higher than the negative bias voltage applied to the tubes, grid current may be drawn, raising the biasing voltage stored on the coupling capacitors. The increased capacitor voltage leads to cross-over distortion in the amplifier output, due to cutoff of tube operation because of increased negative bias by the capacitors.

The relatively soft cut-off characteristic of a vacuum tube, however, provides a tolerable degree of "soft" cross-over distortion in which the cross-over region of a sinusoidal signal, for example, exhibits a reduced slope, but not a zero slope which would result in harsh, intolerable cross-over distortion. The charging of the coupling capacitors, however, also reduces the overall signal level, thus reducing the clipping distortion of the amplifier plate circuit.

The tube type amplifier thus provides a reduced plate clipping characteristic, coupled with soft cross-over distortion due to high level input signals. The combined effects, due to the use of coupling capacitors in the push-pull configuration and the tube characteristics, provide the output compression characteristic previously mentioned.

An attempt to achieve similar reduced clipping and compression characteristics in solid state, transistorized amplifiers by the use of coupling capacitors at the inputs to a pair of common emitter transistors in push-pull configuration is typically unsuccessful, however. Inasmuch as transistors are inherently current amplifying devices, even a slight increase in negative input bias voltage manifested on the coupling capacitors leads to harsh cross-over distortion. Thus, as the input level increases until the occurrence of transistor saturation, the coupling capacitor becomes charged by the increased base current drawn during saturation. When the input level drops, or becomes negative, the transistor, no longer in saturation, cannot provide the necessary levels of base current to discharge the capacitor. The voltage applied to the transistor base cannot keep the transistor in its linear, active region, and the transistor cuts off for such low levels or negative levels of input. The cutoff is harsh, in which a dead-zone, having a zero slope portion, is provided between halves of a sinusoidal signal, for example. See E. A. Angelo, Jr., *Electronic Circuits*, 2d Ed., McGraw-Hill, New York, 1964 at section 11-3, for example.

Prior art devices for reducing cross-over distortion are disclosed in U.S. Pat. Nos. 4,220,930; 4,160,216; 4,237,425 and 3,564,445. A direct coupled push-pull amplifier with a biasing arrangement for linearizing the cut-off characteristics of the output is disclosed in U.S. Pat. No. 3,371,286.

None of the prior art, however, discloses structure for simulating the compression characteristics of a vacuum tube power amplifier in a transistor amplifier.

SUMMARY AND OBJECTS OF THE INVENTION

It is accordingly a primary object of the invention to overcome the deficiencies of the prior art and to provide a transistor power amplifier having a compression characteristic similar to that of a vacuum-tube amplifier.

It is a more specific object of the invention to provide a transistor push-pull amplifier having capacitor input coupling for moderating the effects of high input levels on saturation of the transistor and having circuitry for providing a soft cross-over characteristic for low and negative level input signals.

It is yet another object of the invention to provide an electronic circuit apparatus having a first circuit for effecting a saturation characteristic similar to that of a vacuum tube clipping characteristic, and a second circuit for effecting a cross-over characteristic similar to that of a vacuum-tube soft cross-over characteristic.

In accordance with these and other objects of the invention, a circuit structure is provided including a first circuit for generating signals for driving a transistor amplifier in accordance with a clipping characteristic. The structure includes a second circuit for driving the amplifier in accordance with a cross-over characteristic. A combining circuit is provided for combining the signals output by the first and second circuits and for generating a combined signal to drive the amplifier in accordance with a predetermined soft cross-over characteristic.

The inventive structure includes capacitive coupling and a biasing network in each of the first and second circuits, comprised of diodes, for maintaining a substantially constant bias voltage for a range of currents. Each of the two circuits further includes a connecting circuit for connecting the biasing network to the coupling network and to the combining circuit. The first circuit includes a diode in the connecting circuit, to assure that high level input signals will, indeed, saturate the transistor amplifier. The second circuit includes a resistive connecting circuit, and a further source of biasing current to compensate for outflow of biasing current through the connecting diode in the first circuit at low and negative input signal levels.

Each of the two circuits receives the input drive signal and adds a biasing signal thereto. The combining circuit substantially provides an OR circuit, receiving the outputs of the two circuits and outputting the highest of the two outputs to the transistor amplifier, thus assuring that at high input levels the output of the first circuit saturates the transistor amplifier, and at low input levels the output of the second circuit provides continued linear operation of the amplifier, at reduced but non-zero slope, thus providing a soft cross-over characteristic to compensate for the harsh cross-over which would otherwise be caused by the first circuit, and a compression characteristic similar to tube amplifiers.

BRIEF DESCRIPTION OF THE DRAWING

The foregoing and other objects, features and advantages of the invention will become more readily apparent upon reference to the following detailed description of the preferred embodiment of the invention, when taken in conjunction with the accompanying drawing, wherein like numbers refer to like parts, in which.

DETAILED DESCRIPTION OF THE PREFERRED EMBODIMENT

Figure 1:
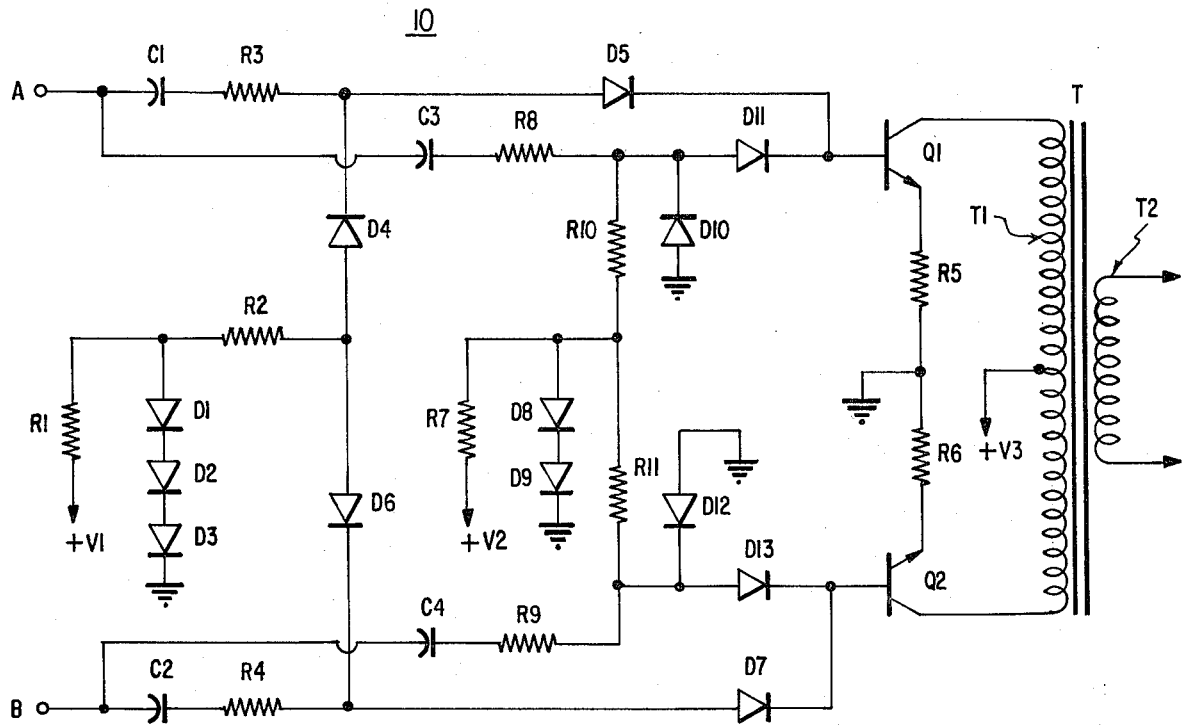
FIG. 1 shows the inventive circuit.

Referring now to the drawing, a circuit in accordance with the invention is shown in FIG. 1, referenced generally by the numeral 10. The circuit includes input terminals, shown at A and B, for receiving a pair of driving signals. As is known in the art, the input signals to a push-pull configuration, as is shown in FIG. 1 for transistors Q1 and Q2, are substantially identical, and of opposite phase.

A phase inverter, not shown, accordingly provides the two oppositely phased signals to inputs A and B of the circuit. Circuit structure 10 includes a plurality of diodes, D1 through D13, resistors R1 through R11, and capacitors C1 through C4, connected as shown, for providing the input signals from inputs A and B to transistors Q1 and Q2. A number of biasing voltages, V1, V2 and V3 are utilized in the structure, and an output transformer T combines the outputs of transistors Q1 and Q2 to provide the system output.

Figure 2:
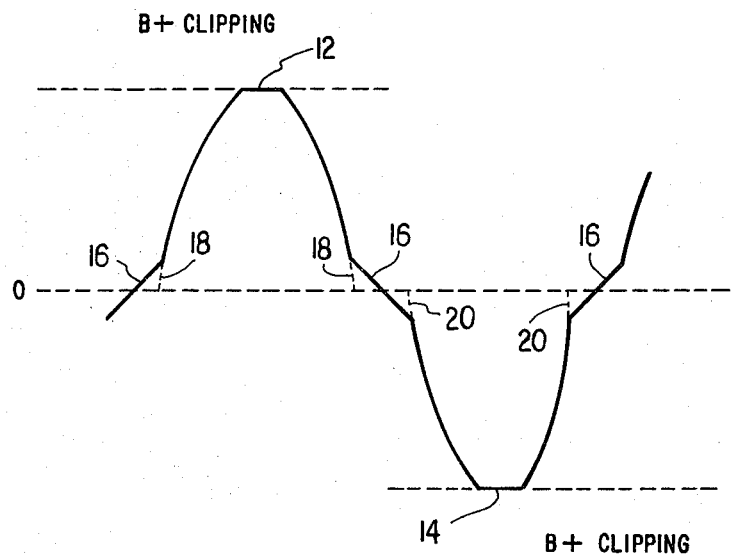
FIG. 2 shows an output waveform of the circuit of FIG. 1.

FIG. 2 shows an output waveform, obtained at secondary winding T2 of FIG. 1, in response to application of a high level input sinusoid at A and B. The waveform of FIG. 2 includes characteristics similar to those obtained in a tube type power amplifier responding to high level sinusoidal inputs.

Specifically, some clipping is provided at the positive and negative peaks of the output signal, 12 and 14. Further, at low values of the output signal, indicated by regions 16 in the vicinity of the zero crossings of the waveform, the output includes regions of reduced slope, simulating a soft cross-over typically provided by tube amplifiers. Such soft cross-overs differ from the harsh, "dead-zone" cross-over provided by typical transistor amplifiers, in which the output waveform typically continues at its normal slope to the zero crossings, as shown in phantom at segments 18 and 20.

As is apparent from segments 18 and 20, in typical transistor amplifiers operating at Class AB, a certain dead-zone exists in the output, during times when the input signal is at a low positive or negative value less than the cut-in voltage of the transistors. By using coupling capacitors, the dead-zone is prolonged and the distortion increased.

The present circuit structure provides a degree of range compression such that, for increasingly higher input signals the output signal experiences progressively more clipping, due to transistor saturation, and longer cross-over regions 16. The present structure thus provides in its output a reproduction of any variations of the input signal, including small variations in the vicinity of zero input which are not reproduced by conventional transistor power amplifiers.

Figure 3:
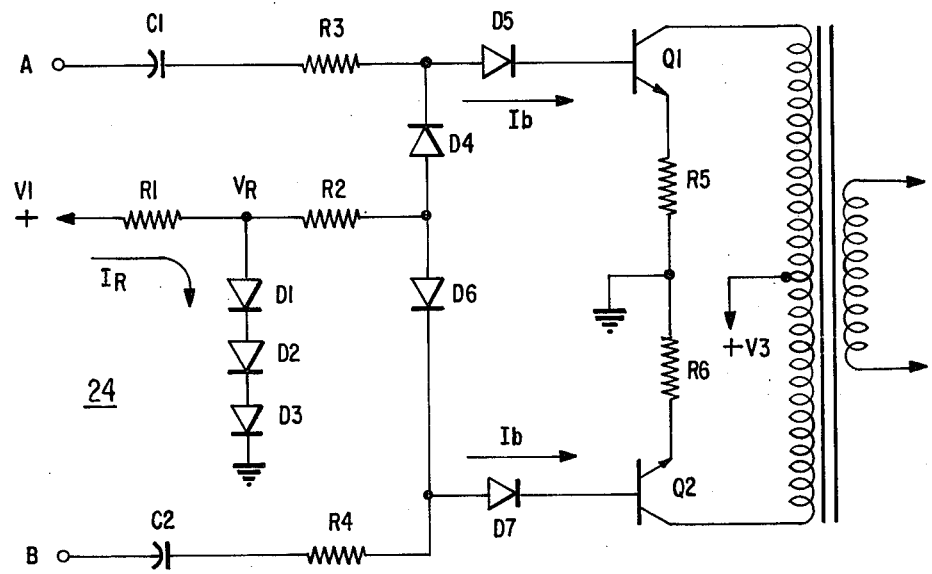
FIG. 3 shows a first component circuit of the circuit of FIG. 1.
Figure 4:
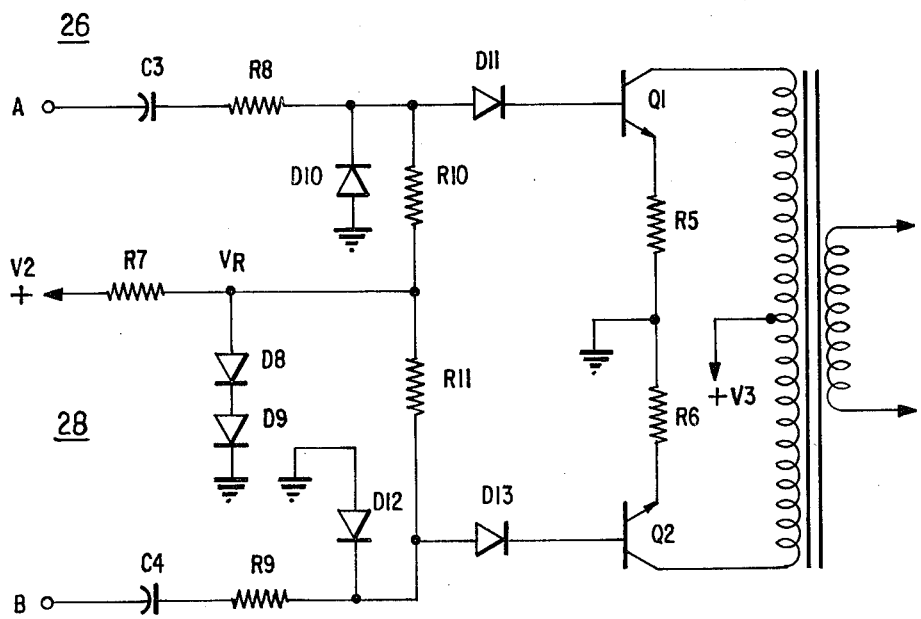
FIG. 4 shows a second component circuit of the circuit of FIG. 1.

In order better to explain operation of the circuit shown in FIG. 1, two of its component circuits are separately shown in FIGS. 3 and 4.

Referring to FIG. 3, a first circuit 22 is shown, receiving the input signals of input terminals A and B through a pair of coupling capacitors C1 and C2. First circuit 22 includes a first biasing circuit 24, comprised of diodes D1, D2 and D3, forward biased by a current $I_R$ drawn from voltage source V1 through resistor R1. The three silicon diodes establish a reference voltage $V_R$ which remains fairly constant over a range of values of the current $I_R$.

This voltage establishes a small quiescent idle current into transistors Q1 and Q2 to prevent cross-over distortion for low signal levels. As is known in the art, instead of using forward biased diodes, an appropriately valued Zener diode or diodes may be used.

In order to provide for saturation of the transistors Q1 and Q2 for high levels of input signals, reference voltage $V_R$ is connected to the coupling network which includes capacitor C1 and resistor R3 by a diode D4, and to the coupling network C2–R4 by a diode D6. Thus, as input voltage and current levels rise, the increase is transmitted to the transistors Q1 and Q2 by diodes D5 and D7, rather than being transmitted to the biasing network 24. Operation at input levels above a value determined by the values of $V_R$, R2, R3 and R4 thus results in saturation, manifested as clipping of the output signal at 12 and 14 in FIG. 2. However, as described below, when Q1 and Q2 saturate, biasing network 24 cannot continue to supply the idle current to prevent cross-over distortion.

Circuit 22 thus maintains proper class AB operation without cross-over distortion only when Q1 and Q2 do not saturate.

Because of the polarity of diodes D4–D5 and D6–D7, it is seen that positive input currents at terminals A and B are directed to Q1 and Q2 by diodes D5 and D7, respectively. Negative input currents, however, are directed to biasing network 24 through diodes D4 and D6. Similarly, for reduced input currents, base current Ib for driving transistors Q1 and Q2 is obtained through diodes D4 and D6 from biasing network 24, and specifically from current $I_R$. The needed increment for base currents Ib does not affect the reference voltage $V_R$ so long as the increment is less than $I_R$. That is, as long as some current can continue to flow through diodes D1, D2 and D3 in the forward direction, the voltage $V_R$ will remain substantially constant, and operation of transistors Q1 and Q2 will be in the linear range.

For high levels of input signal, however, in which transistors Q1 and Q2 saturate, first circuit 22 is called upon to supply substantially increased base currents thereto. This phenomenon is known in the art, and follows from the known reduction in $h_{FE}$, or beta, for a transistor when operating in saturation. The required increment in Ib exceeds $I_R$, thus reducing the reference voltage $V_R$ as diodes D1–D3 stop conducting.

The drop in $V_R$ decreases the voltage applied to the base of Q1 and Q2, and increases the negative bias provided by capacitors C1 and C2. This condition causes the amplifier to operate with a dead-zone, providing cross-over distortion illustrated by an output voltage waveform having segments 18 and 20 therein as shown in FIG. 2.

First circuit 22 thus provides saturation of transistors Q1 and Q2 for overloaded, or high level, input signals, and concommitently provides a pronounced dead-zone operation.

A second circuit 26, shown in FIG. 4, is provided for overcoming the dead-zone defects of first circuit 22.

As shown in FIG. 4, the input signals of terminals A and B are received through coupling circuits including C3–R8 and C4–R9, for cooperation with the remaining portions of second circuit 26. The circuit includes a second biasing network 28, comprised of diodes D8 and D9, forward biased by current flowing from a voltage source V2 through resistor R7, to establish a second reference voltage $V_R'$. While V2 is indicated as a separate source from V1, both in FIG. 4 and in FIG. 1, both voltages may be provided by a common source.

Reference voltage $V_R'$ is applied to the bases of Q1 and Q2 through a connecting network including R10–D11 and R11–D13, respectively. It is noted that, inasmuch as two diodes are used in biasing network 28, while three diodes are used in biasing network 24, the voltage $V_R$ is greater than the voltage $V_R'$. Advantageously, it is noted that with a lower reference voltage $V_R'$, second circuit 26 will require a higher level input signal to saturate transistors Q1 and Q2 than will first circuit 22. A further aspect of the circuitry is the use of resistors R10 and R11 to connect the reference voltage to the coupling circuits, so that large input currents need not be totally directed to the bases of Q1 and Q2, as is the case for the circuit of FIG. 3. Negative input currents, however, are directed through diodes D10 and D12 to ground, unlike the circuit of FIG. 3 in which such negative signals were directed to the biasing network.

The circuit of FIG. 4 thus can maintain the value of the reference voltage $V_R'$ even for low, or negative values of the input signal, thus maintaining a constant bias on capacitors C3 and C4, and on the bases of Q1 and Q2. As a result, circuit 26 continues to drive transistors Q1 and Q2 in a linear fashion, without dead-zone or cross-over distortion, whether high or low level input signals are provided to terminals A and B. The specific slope of the output waveform in the regions 16 is dependent upon the value of resistors R8 and R9. More particularly, the difference in slopes between the "linear" waveform and the "cross-over" segments is directly proportional to the ratio of the values of the respective drive, or coupling resistors, R8–R9 to R3–R4. In the preferred embodiment this ratio is 1:10.

Referring once again to FIG. 1, it is seen that the circuits 22 and 26 are combined, by diodes D5–D11 and D7–D13, to provide a combined driving current for transistors Q1 and Q2, respectively. Both circuits, of course, receive their input signals from a common phase inverter circuit, providing input signals at terminals A and B which are 180° out of phase with each other.

The combining circuit is seen to form a pair of OR gates, formed of diodes D5–D11 and D7–D13, respectively. Thus, the higher of the voltages at the anodes of diodes D5 or D11 is passed to the base of Q1, and the higher of the voltages at the anodes of diodes D7 or D13 is passed to the base of Q2.

From the foregoing analysis it is seen that, in non-overload conditions, i.e., moderate peak level input signals which do not saturate Q1 and Q2, $V_R$ is greater than $V_R'$, so that first circuit 22 controls the output of transistors Q1 and Q2 and the circuit output taken at secondary winding T2.

For high peak value input signals, however, in which first circuit 22 causes Q1 and Q2 to enter saturation and the output waveform to exhibit clipping, the situation differs. As described in the foregoing analysis, when the actual instantaneous input signal is at low or slightly negative values, in the vicinity of zero, the current $I_R$ is diverted from diodes D1–D2–D3, thus reducing $V_R$ and lowering the voltage at the anode of diode D5. In the second circuit 26, however, for such input conditions the necessary base current is drawn through diodes D10 and D12, thereby maintaining reference voltage $V_R'$ substantially constant, and higher than $V_R$. The voltage at the anodes of diodes D11 and D13, when the instantaneous input voltage is in the vicinity of zero, is thus greater than that at the anodes of D5 and D7. Circuit 26 thus controls operation of the transistors in the vicinity of zero-crossings, and provides operation at the reduced slope of segments 16 of FIG. 2 rather than with dead-zone cross-over distortion illustrated by segments 18, 20.

As is further shown in FIG. 1, transistors Q1 and Q2 receive collector biasing through center-tapped primary winding T1 of transistor T. Voltage V3 may be provided by a common source which simultaneously provides voltages V1 and V2.

The collectors of Q1 and Q2, however, rather than providing output signals to transformer T, may instead be used to drive the cathodes of a pair of grounded grid tubes, such as 6L6GC's, for example, in which the plates provide the output signals to the primary winding of the output transformer.

In other aspects of the invention, the series connected diodes of the biasing networks may be connected to the heatsinks of the transistors Q1 and Q2, thereby to provide thermal tracking at elevated operating temperatures. As a further reduction of the cross-over distortion introduced by the first circuit 22, a diode (not shown) may be switchably connected from the junction of the anodes of D4, D6, and resistor R2 to ground. Upon closing the connecting switch, it is seen that negative input signals may be supplied with current through the added diode, rather than through reduction of the operating current of diodes D1–D2–D3, thereby to maintain the reference voltage $V_R$ at a more constant level and to reduce the dead-zone previously described.

It should also be recognized that inasmuch as second circuit 26 is intended to maintain reference voltage $V_R'$ substantially constant, diodes D8 and D9 may be replaced by any constant voltage source, including a battery, for example, to assure that the zero-crossing operation of the combined structure will be dominated by circuit 26.

As a further feature, it is noted that any number of circuits of the type 22 and 26 may be provided, each operative for a specific range of input signals and having a predetermined linear characteristic. The outputs of the various circuits may be combined in an OR type circuit having a plurality of input diodes, to construct a piecewise linear approximation of a tube amplifier characteristic. By providing a sufficient number of such circuits, it is seen that a transistor amplifier may be provided with an operating characteristic which is arbitrarily close to that of a tube type amplifier. The appearance of the zero-crossing portions of the output signal may thus approach the curved shape of a tube amplifier more closely than the first order approximation of the present circuit, shown in FIG. 2.

The preceeding specification describes the preferred embodiment of the invention as an illustration and not a limitation thereof. It is appreciated that equivalent variations and modifications of the invention will occur to those skilled in the art. Such modifications, variations and equivalents are within the scope of the invention as recited with greater particularity in the appended claims, when interpreted to obtain the benefits of all equivalents to which the invention is fairly and legally entitled.

I claim:

1. A circuit structure for driving a transistor amplifier to respond to an input signal in accordance with a predetermined clipping and soft cross-over characteristic comprising:

(a) first circuit means for generating first signals for driving said transistor amplifier in accordance with a first, clipping characteristic;

(b) second circuit means for generating second signals for driving said transistor amplifier in accordance with a second, cross-over characteristic; and (c) combining means for combining said first and second signals and for generating a combined signal for driving said transistor amplifier in accordance with said predetermined soft cross-over characteristic.

2. The circuit structure recited in claim 1 wherein said first and second circuit means each include coupling means having capacitor means therein, biasing means for providing substantially constant bias voltages over predetermined ranges of bias currents, and means for connecting said biasing means to said coupling means and to said combining means.

3. The circuit structure recited in claim 2 wherein said biasing means comprise diode networks.

4. The circuit structure recited in claim 3 wherein said means for connecting said biasing means in said first circuit means comprise diode means, and said means for connecting said biasing means in said second circuit means to said coupling network comprises resistance means.

5. The circuit structure recited in claim 2 wherein said first circuit means includes, in its means for connecting, unidirectional conducting means for preventing high level inputs from passing to said biasing means thereof, and said second circuit means includes means for providing low and negative input level drive signals to a point electrically distinct from said biasing means thereof, said second circuit means thereby maintaining a substantially constant voltage on said capacitor means in said coupling means thereof for avoiding cross-over distortion in said transistor amplifier.

6. The circuit structure recited in claim 5 wherein said biasing network means of said first circuit means includes means for providing a substantially constant voltage for a predetermined range of bias current and for saturating said transistor amplifier for high input levels, whereby said transistor amplifier saturates for high level input signals and provides a soft cross-over characteristic to simulate operation of a vacuum tube amplifier.

7. The circuit structure recited in claim 6 wherein said biasing means of said first circuit means includes a plurality of diodes chosen for appropriate saturation of said transistor amplifier, and a resistive connection to a voltage source, whereby said unidirectional conducting means provides negative input drive signals to said biasing network, said biasing means and said coupling means of said first circuit means thus providing to said combining means a high voltage for saturating said transistor amplifier in response to high level input signals and a low voltage, capable of generating cross-over distortion in said transistor amplifier, in response to low level input signals.

8. The circuit structure recited in claim 7 wherein said biasing means of said second circuit means includes a plurality of diodes chosen for providing substantially constant voltage to said transistor amplifier, higher than said low voltage provided by said biasing means and said coupling means of said first circuit means for low level input signals, and lower than said high voltage of said biasing means and said coupling means of said first circuit means for high level input signals.

9. The circuit structure recited in claim 5 wherein said means for providing negative and low level input drive signals in said second circuit means to a point distinct from said biasing means thereof comprises a unidirectional conducting means for providing additional bias current when low and negative level input drive signals are provided.

10. The circuit structure recited in claim 1 wherein said combining means comprises ORing means for providing the highest of said first and second signals to said transistor amplifier.

11. Circuit structure for causing a push pull transistor amplifier responding to an input signal to simulate a vacuum tube amplifier having a compression characteristic and soft cross-over distortion, comprising:

first circuit means for providing saturation of said transistor amplifier to simulate clipping in a vacuum tube amplifier, including first biasing means for generating a first bias voltage for addition to said input signal, thereby saturating said transistor amplifier for levels of said input signal in excess of a predetermined clipping level;

second circuit means for providing soft cross-over distortion by said transistor amplifier, including:

second biasing means for generating a second bias voltage for addition to said input signal, said second bias voltage being lower than said first bias voltage to avoid saturation below said predetermined clipping level, said second bias means including additional source of bias current for low level signals thereby to maintain substantially constant bias voltage for said transistor amplifier and to provide a predetermined non-zero value of output current for near zero values of said input signal, and combining means for providing the larger of the sums of said input signal and said first or second bias voltages to said transistor amplifier, whereby reductions in said first bias voltage due to low or negative values of input signals which would otherwise cause cross-over distortion are compensated for by said second bias voltage.

12. The circuit structure recited in claim 11 wherein said transistor amplifier is used to drive a pair of vacuum tubes in grounded grid configuration.

13. The circuit structure recited in claim 11 wherein said transistor amplifier includes a pair of transistors biased for class AB operation.

* * * * *